United States Patent
Abraham et al.

(10) Patent No.: US 12,033,981 B2
(45) Date of Patent: Jul. 9, 2024

(54) CREATE A PROTECTED LAYER FOR INTERCONNECTS AND DEVICES IN A PACKAGED QUANTUM STRUCTURE

(71) Applicant: International Business Machines Corporation, Armonk, NY (US)

(72) Inventors: David Abraham, Croton, NY (US); Oliver Dial, Yorktown Heights, NY (US); John Michael Cotte, New Fairfield, CT (US); Kevin Shawn Petrarca, Newburgh, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/123,350

(22) Filed: Dec. 16, 2020

(65) Prior Publication Data

US 2022/0189922 A1    Jun. 16, 2022

(51) Int. Cl.
| | |
|---|---|
| *H01L 25/065* | (2023.01) |
| *H01L 21/768* | (2006.01) |
| *H01L 23/06* | (2006.01) |
| *H01L 23/48* | (2006.01) |
| *H01L 25/00* | (2006.01) |

(52) U.S. Cl.
CPC .... *H01L 25/0657* (2013.01); *H01L 21/76898* (2013.01); *H01L 23/06* (2013.01); *H01L 23/481* (2013.01); *H01L 25/50* (2013.01); *H01L 2225/06513* (2013.01)

(58) Field of Classification Search
CPC ........... H01L 25/0657; H01L 21/76898; H01L 23/06; H01L 23/481; H01L 25/50; H01L 2225/06513
See application file for complete search history.

(56) References Cited

U.S. PATENT DOCUMENTS

| | | | |
|---|---|---|---|
| 10,068,181 | B1 | 9/2018 | Rigetti |
| 10,121,754 | B2 | 11/2018 | Oliver et al. |
| 10,134,972 | B2 | 11/2018 | Oliver et al. |
| 10,157,842 | B1 | 12/2018 | Abraham et al. |
| 10,380,496 | B2 | 8/2019 | Elsherbini et al. |

(Continued)

FOREIGN PATENT DOCUMENTS

| | | | | |
|---|---|---|---|---|
| WO | 2017105524 A1 | 6/2017 | | |
| WO | WO-2020027779 A1 | * | 2/2020 | ......... H01L 21/4857 |

OTHER PUBLICATIONS

Micromachined integrated quantum circuit containing a superconducting qubit BRECHT-etal-2016 arXiv:1611.02166v1 [quant-ph] Nov. 7, 2016.

Multilayer microwave integrated quantum circuits for scalable quantum computing BRECHT-etal-2015 arXiv:1509.01127v2 [quant-ph] Sep. 11, 2015.

(Continued)

*Primary Examiner* — Mamadou L Diallo
(74) *Attorney, Agent, or Firm* — Erik Johnson

(57) ABSTRACT

A semiconductor device comprises a first chip layer, having a first chip layer front-side and a first chip layer back-side, a qubit chip layer, having a qubit chip layer front-side and a qubit chip layer back-side, the qubit chip layer front-side operatively coupled to the first chip layer front-side with a set of bump-bonds, a set of through-silicon vias (TSVs) connected to at least one of: the first chip layer back-side or the qubit chip layer back-side and a cap wafer metal bonded to at least one of: the qubit chip layer back-side or the first chip layer back-side.

16 Claims, 8 Drawing Sheets

(56) References Cited

U.S. PATENT DOCUMENTS

| | | | |
|---|---|---|---|
| 10,381,541 B2 | 8/2019 | Das et al. | |
| 10,424,711 B2 | 9/2019 | Schoelkopf, III et al. | |
| 10,424,712 B2 | 9/2019 | Schoelkopf, III et al. | |
| 10,468,740 B2 | 11/2019 | Minev et al. | |
| 10,529,908 B2 | 1/2020 | Hertzberg et al. | |
| 10,535,809 B1* | 1/2020 | Vodrahalli | H01L 39/025 |
| 10,756,004 B1* | 8/2020 | Elsherbini | H01L 23/13 |
| 10,769,546 B1* | 9/2020 | Rigetti | H01L 39/045 |
| 2013/0258595 A1* | 10/2013 | Tuckerman | H01L 23/445 |
| | | | 361/701 |
| 2016/0364653 A1* | 12/2016 | Chow | H01L 39/045 |
| 2018/0012932 A1* | 1/2018 | Oliver | H01L 39/04 |
| 2018/0013052 A1* | 1/2018 | Oliver | H01L 25/0652 |
| 2018/0102470 A1* | 4/2018 | Das | H01L 39/2493 |
| 2018/0366634 A1* | 12/2018 | Mutus | H01L 24/10 |
| 2019/0181256 A1* | 6/2019 | Roberts | H01L 25/50 |
| 2019/0273197 A1* | 9/2019 | Roberts | H01L 39/045 |
| 2020/0012961 A1* | 1/2020 | Kelly | H01L 23/5225 |
| 2020/0119251 A1* | 4/2020 | Yohannes | H01L 39/223 |
| 2020/0161531 A1* | 5/2020 | Olivadese | B82Y 10/00 |
| 2020/0259064 A1* | 8/2020 | Lewandowski | H01L 24/81 |
| 2020/0364600 A1* | 11/2020 | Elsherbini | H01L 21/486 |
| 2020/0381608 A1* | 12/2020 | Olivadese | B82Y 10/00 |
| 2021/0076530 A1* | 3/2021 | Hart | F25D 19/006 |
| 2021/0091062 A1* | 3/2021 | Boothby | H05K 1/182 |
| 2021/0159382 A1* | 5/2021 | Nah | G06N 10/00 |

OTHER PUBLICATIONS

Zoschke-et al., Polyimide based temporary wafer bonding technology for high temperature compliant TSV backside processing and thin device handling 2012 IEEE 62nd Electronic Components and Technology Conference Year: 2012, Conference Paper.

Mell et al., "The NIST Definition of Cloud Computing," Recommendations of the National Institute of Standards and Technology, NIST Special Publication 800-145, Sep. 2011, 7 pages.

Brecht et al., "Micromachined integrated quantum circuit containing a superconducting qubit", arXiv:1611.02166v1 [quant-ph], Nov. 7, 2016, pp. 1-7.

Brecht et al., "Multilayer microwave integrated quantum circuits for scalable quantum computing", arXiv:1509.01127v2 [quant-ph], Sep. 11, 2015, pp. 1-5.

O'Brian W et al: "Superconducting Caps for Quantum Integrated Circuits", arXiv:1708.02219v1 [physics.app-ph], Aug. 7, 2017, © Copyright 201 7 Rigetti & Co, Inc., 4 pages.

Zoschke et al, "Polyimide based temporary wafer bonding technology for high temperature compliant TSV backside processing and thin device handling", 2012 IEEE 62nd Electronic Components and Technology Conference Year: 2012, Conference Paper, © 2012 IEEE, pp. 1054-1061.

International Search Report and Written Opinion, International Application No. PCT/EP2021/85415. International Filing Date Dec. 13, 2021.

* cited by examiner

CREATE A PROTECTED LAYER FOR INTERCONNECTS AND DEVICES IN A PACKAGED QUANTUM STRUCTURE

TECHNICAL FIELD

The subject disclosure relates to using superconducting through-silicon vias (TSVs) to access high-quality surface on a back side of a qubit or interposer wafer. A metal bond is used to attach a special cap wafer at a top of a thinned qubit wafer, forming a fully enclosed metal channel in which long-range connections are fabricated.

BACKGROUND

Quantum computing generally utilizes quantum-mechanical phenomena to perform computing and information processing functions. Quantum computers operate on quantum bits that comprise superpositions of both 0 and 1, can entangle multiple quantum bits, and use interference. A qubit (e.g., quantum binary digit) is a quantum mechanical analogue of a classical bit. Superconducting qubits offer a promising path towards constructing fully-operational quantum computers as it can exhibit quantum-mechanical behavior (e.g., facilitating quantum information processing) at a macroscopic level. Superconducting qubits are multilevel systems, and the two lowest energy levels (0 and 1) constitute the qubit. One of the challenges in quantum computing is to protect quantum information (e.g., qubit state) and mitigate errors during dynamic quantum computation. A typical quantum circuit packaging includes two chips joined by bump bonds, with only inward facing surfaces utilized for devices and signal delivery/readout. The qubit chip surface is utilized for qubits and the interconnections which allow qubits to entangle. Although it is possible to mix functions between these two layers, the intersecting patterns of lines mean that the bump bonds are often utilized to provide crossovers in various locations. Having only two high quality surfaces arranged with vertical connections limits the type of structures that can be built. For example, in one non-limiting scenario, with nearest-neighbor coupling implemented on the qubit surface, adding a second set of connections to more distant qubits would require transferring coupling lines down to an interposer surface and back up to the qubit surface to achieve crossovers. This would make coupling potentially less high quality, would complicate layout greatly, and likely lead to increased signal crosstalk.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate using superconducting through-silicon vias to access high-quality surface on the back side of the qubit or interposer wafer. A metal bond is utilized as a special cap wafer at the top of the thinned qubit wafer, forming a fully enclosed metal channel in which the long-range connections are fabricated.

In accordance with an embodiment, a device comprises: a first chip layer that employs a first chip layer front-side and a first chip layer back-side; a qubit chip layer that employs a qubit chip layer front-side and a qubit chip layer back-side wherein the qubit chip layer front-side is operatively coupled to the first chip layer front-side with a set of bump-bonds; a set of through-silicon vias (TSVs) connected to at least one of: the first chip layer back-side or the qubit chip layer back-side; and a cap wafer metal bonded to at least one of: the qubit chip layer back-side or the first chip layer back-side.

In an optional aspect, the first chip is an interposer chip.

In an optional aspect, the at least one of the qubit chip layer back-side or the first chip layer back-side is operatively coupled to a filter.

In an optional aspect, the at least one of the qubit chip layer back-side or the first chip layer back-side is operatively coupled to a qubit feed line.

In an optional aspect, the at least one of the qubit chip layer back-side or the first chip layer back-side is operatively coupled to a resonator.

In an optional aspect, the at least one of the qubit chip layer back-side or the first chip layer back-side is operatively coupled to a coupler.

In another aspect, a Q factor is associated with interconnects of the device is at least 100000.

In yet another aspect, the Q factor associated with interconnects of the device is within the range of about 500000 to 20000000.

In accordance with an embodiment, a method, comprises: forming a first chip layer, having a first chip layer front-side and a first chip layer back-side; forming a set of bump bonds on the first chip layer front-side; forming a qubit chip layer, having a qubit chip layer front-side and a qubit chip layer back-side, the qubit chip layer front-side operatively coupled to the first chip layer front-side with the set of bump bonds; forming a set of through-silicon vias (TSVs) connected to at least one of: the first chip layer back-side or the qubit chip layer back-side; and forming a cap wafer metal bonded to at least one of: the qubit chip layer back-side or the first chip layer back-side.

In an optional aspect, the method further comprises coupling the at least one of the qubit chip layer back-side or the first chip layer back-side to a filter.

In an optional aspect, the method further comprises coupling the qubit chip layer back-side or the first chip layer back-side to a qubit feed line.

In an optional aspect, the method further comprises coupling the qubit chip layer back-side or the first chip layer back-side to a resonator.

In an optional aspect, the method further comprises coupling the qubit chip layer back-side or the first chip layer back-side to a coupler.

DETAILED DESCRIPTION

Figure 1:
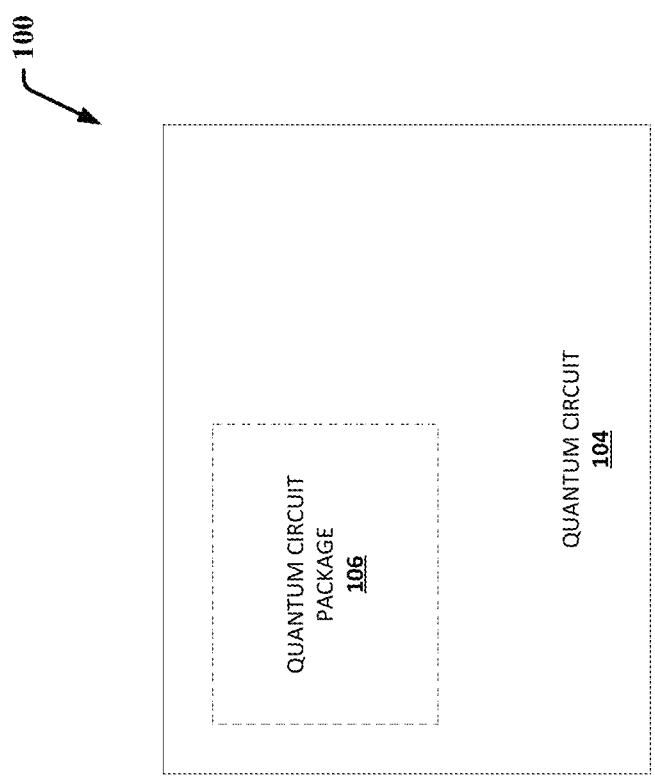
FIG. 1 illustrates a block diagram of an example system implementation in accordance with embodiments.

The following detailed description is merely illustrative and is not intended to limit embodiments and/or application or utilizes of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

The subject disclosure relates generally to systems, devices and methods that utilize superconducting TSVs to access a high-quality surface on a back side of a qubit or interposer wafer. In order to protect new surfaces from proximity to lossy materials such as adhesive or silicon oxide, a metal bond is formed on a special cap wafer at a top of a thinned qubit wafer, forming a fully enclosed metal channel in which long-range connections are fabricated.

Quantum computation utilizes a qubit as its essential unit instead of a classical computing bit. The qubit (e.g., quantum binary digit) is the quantum-mechanical analog of the classical bit. Whereas classical bits can employ on only one of two basis states (e.g., 0 or 1), qubits can employ on superpositions of those basis states (e.g., $a|0\rangle + \beta|1\rangle$, where $\alpha$ and $\beta$ are complex scalars such that $|\alpha|^2 + |\beta|^2 = 1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, etc. Qubits, partaking of the quantum mystique, can occupy a superposition of 0 and 1 states. It's not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1. General quantum programs require coordination of quantum and classical parts of a computation. In quantum programs, identifying processes and abstractions involved in specifying a quantum algorithm, transforming the algorithm into executable form, running an experiment or simulation, and analyzing the results is valuable. A notion throughout these processes utilizes intermediate representations. An intermediate representation (IR) of computation is neither its source language description nor the target machine instructions, but something in between. Compilers may utilize several IRs during the process of translating and optimizing a program. The input is a source code describing a quantum algorithm and compile time parameter(s). The output is a combined quantum/classical program expressed using a high-level IR. A distinction between a quantum and classical computer is that the quantum computer is probabilistic, thus measurements of algorithmic outputs provide a proper solution within an algorithm specific confidence interval. The computation is then repeated until a satisfactory probable certainty of solution can be achieved.

By processing information using laws of quantum mechanics, quantum computers offer novel ways to perform computation tasks such as molecular calculations, optical photons, optimization, and many more. Many algorithms are introduced to perform such computational tasks efficiently. Also, many promising solid-state implementations of qubits have been demonstrated, including superconducting qubits of diverse flavors, spin qubits, and, charge qubits in various material systems. Typical quantum circuit packaging includes two chips with only inward facing surfaces utilized for devices and signal delivery/readout. The qubit chip surface is utilized for qubits and the interconnections which allow qubits to entangle. The interposer surface is utilized for readout resonators, filters, and feed and readout lines. Although it is possible to mix functions between these two layers, the intersecting patterns of respective lines means that bump bonds are utilized to provide crossovers in these locations. Having only two high quality surfaces arranged with vertical connections limits the kind of structures that can be built. For example, it is difficult to arrange more complicated interaction schemes (for example to allow distant qubits to couple together) using only two surfaces. With nearest-neighbor coupling implemented on a qubit surface, adding a second set of connections to more distant qubits would require transferring coupling lines down to an interposer surface and back up to the qubit surface in order to achieve crossovers. This would make the coupling potentially less high quality, would complicate layout greatly, and likely lead to increased signal crosstalk.

In general, there are various processes used to form a micro-chip that will be packaged into an integrated circuit (IC). In particular, semiconductor doping is the modification of electrical properties by doping, for example, transistor sources and drains, generally by diffusion and/or by ion implantation. Moreover, films of both conductors (e.g., poly-silicon, aluminum, copper, etc.) and insulators (e.g., various forms of silicon dioxide, silicon nitride, etc.) are used. Various transistors can be built and wired together by creating structures of these various components to form complex circuitry of a modern microelectronic device. One of the fundamental fabrication processes is semiconductor lithography wherein patterns on the semiconductor substrate is formed for subsequent transfer of the pattern to the substrate.

Semiconductor devices are used in variety of electronic and electro-optical applications. ICs are typically formed from various circuit configurations of semiconductor devices such as transistors, capacitors, resistors and conductive interconnect layers formed on semiconductor wafers. In a semiconductor fabrication process, conductive interconnect layers along with semiconductor devices are fabricated on a single wafer. The interconnect layers are connected by a network of holes (or vias) formed through the IC. In particular, a through-silicon via (TSV) is an electrical contact that passes completely through a semiconductor wafer.

Fabricating intricate structures of conductive interconnect layers and vias within an IC is a process intensive and cost sensitive portion of a semiconductor IC fabrication. Thus, embodiments herein propose to utilize superconducting TSVs to access a high-quality surface on a back side of a qubit or interposer wafer. In order to protect the new surfaces from proximity to lossy materials such as adhesive or silicon oxide, a metal bond is formed on a special cap wafer to the top of a thinned qubit wafer, forming a fully enclosed metal channel in which long-range connections are fabricated. Embodiments facilitate a second interconnect layer for long-range bus connections in addition to nearest neighbor connections which already exist on a qubit bottom surface.

FIG. 1 illustrates a block diagram of an example system 100 that can access data and process that data using variable computing components depicted in accordance with one or more embodiments described herein. The system 100 can facilitate a process of assessing and identifying large amounts of various forms of data, using machine learning, and training a neural network or other type of model. The system 100 can also generate predictive recommendations to an individual level with context in accordance with one or more embodiments described herein. Aspects of systems (e.g., system 100 and the like), apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform operations described herein. Repetitive description of like elements employed in one or more embodiments described herein is omitted for sake of brevity.

The system 100 can facilitate a process of assessing and identifying a large amount of various forms of data. The system 100 can also generate predictive recommendations to an individual level resulting in a context in accordance with one or more embodiments described herein. Aspects of systems (e.g., system 100 and the like), apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. Repetitive description of like elements employed in one or more embodiments described herein is omitted for sake of brevity.

System 100 can optionally include a server device, one or more networks and one or more devices (not shown). The system 100 can also include or otherwise be associated with a quantum circuit 104 incorporating a quantum circuit package 106, that can operatively couple various components shown in greater detail in FIGS. 2, 3 and 5 including, but not limited to, a first chip layer that employs a first chip layer front-side and a first chip layer back-side, a qubit chip layer that employs a qubit chip layer front-side and a qubit chip layer back-side wherein the qubit chip layer front-side is operatively coupled to the first chip layer front-side with a set of bump-bonds, a set of through-silicon vias (TSVs) that is connected to at least one of: the first chip layer back-side or the qubit chip layer back-side and a cap wafer that is metal bonded to at least one of: the qubit chip layer back-side or the first chip layer back-side.

Figure 2:
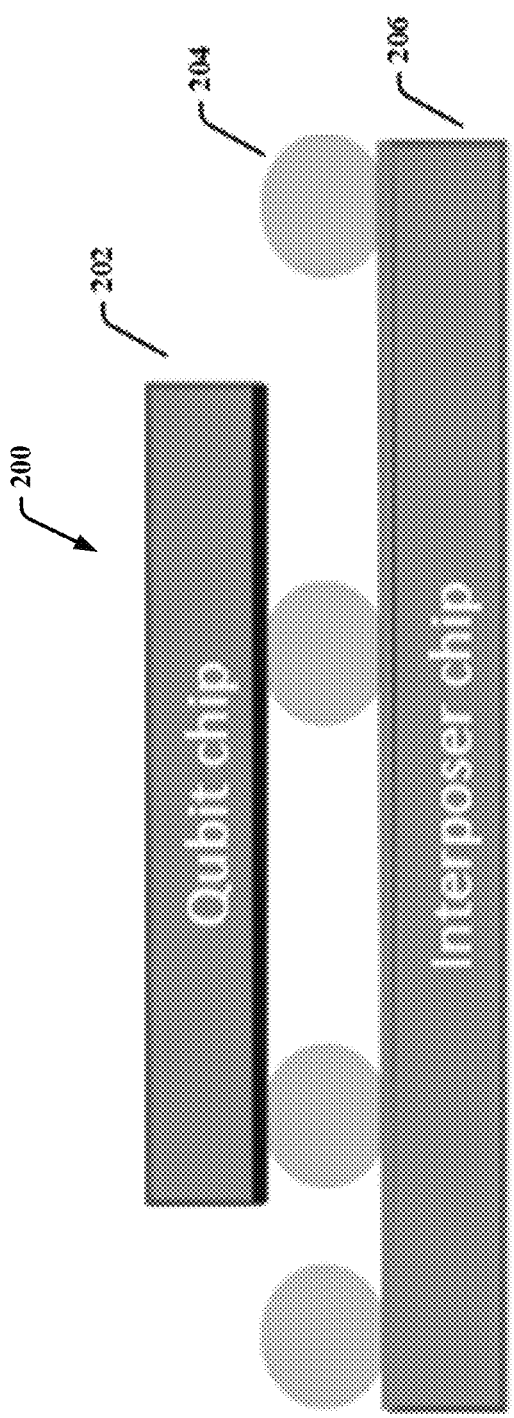
FIG. 2 illustrates an example quantum circuit packaging in accordance with embodiments.

In an implementation, the quantum circuit 104 incorporates as semiconductor package structure 200 as shown in FIG. 2 with a first chip layer 206 that employs a first chip layer (or interposer chip 206) having a front-side and a first chip layer back-side. A qubit chip layer 108 has a qubit chip layer front-side and a qubit chip layer back-side wherein the qubit chip layer front-side is operatively coupled to the first chip layer front-side with a set of bump-bonds 204. For example, in connection with oscillators or resonators, a quality (Q) factor associated with interconnects of the device is approximately 100000 and is within range of about 500000 to 2000000. In other examples such as interconnects, it is characterized by loss. One of the qubit chip layer back-side or the first chip layer back-side can be operatively coupled to a filter, a qubit feed line, a resonator, or a coupler (not shown). A set of through-silicon vias (TSVs) is connected to at least one of: the first chip layer back-side or the qubit chip layer back-side and a cap wafer metal can be bonded to at least one of: the qubit chip layer back-side or the first chip layer back-side. In a non-limiting scenario, qubits of the qubit chip layer are on an exposed surface. Moreover, a set of qubits of the qubit chip layer can be connected by in-plane buses and buried layer buses wherein in-plane buses are on the first qubit chip surface and the buried layer buses are on the second qubit chip surface. The cap wafer employs at least one cavity that comprises a metal coating inside the cavity which is either the same or a different metal than the bonding metal and this metal may contact with the bonding metal to provide a solid ground. Moreover, the inter-connection material can consist of at least one of: In, InSn, PbSn, SnAgCu, InBiSn, InSnAg, SnAg, InAg, or any suitable material.

In a specific non-limiting implementation, for example, a TSV is formed by opening through the semiconductor wafer at a desired location, and then filling the via with conductive material, thereby providing a solid metal contact that extends from a front side of the wafer to a back side of the wafer. Some considerations in forming TSVs include the conductive metal fill of the via wherein it is substantially planar with the front side of the wafer and the back side of the wafer to be compatible with downstream processing techniques. To minimize fabrications problems, it is desirable to fill vias with conductive material such that no voids are present. It is also desirable to facilitate fabrication methodologies and structures for TSVs that utilize high purity low-void conductive material and are less dependent than known techniques on aspect-ratio of the vias Thus, embodiments provide improved techniques for creating a protected layer for interconnects and devices in a packaged structure. In these embodiments, qubits are connected by TSVs through a buried metallized layer on which coplanar waveguide (CPW) or strip line connections are formed along with metal-metal bonding between two wafers. The qubits are on exposed surface and they are connected by both in-plane busses and buried layer busses to increase complexity wherein the in-plane buses are on the first qubit chip surface while the buried layer buses are on the second qubit chip surface. In this three-surface structure which consists of interposer, qubit chip, and a buried layer, the cavities are etched into a silicon cap to facilitate space for connection lines. The cavity allows for shielding of the bus line or other device, which is achieved by metal coating inside the cavity. This forms a complete Faraday cage around the protected bus or the device.

System 100 can be any suitable computing device or set of computing devices that can be communicatively coupled to devices, non-limiting examples of which can include, but are not limited to, a server computer, a computer, a mobile computer, a mainframe computer, an automated testing system, a network storage device, a communication device, a web server device, a network switching device, a network routing device, a gateway device, a network hub device, a network bridge device, a control system, or any other suitable computing device. A device can be any device that can communicate information with the systems 100 and/or any other suitable device that can employ information provided by system 100. It is to be appreciated that systems 100, components, models or devices can be equipped with communication components (not shown) that enable communication between the system, components, models, devices, etc. over one or more networks.

The various components of systems 100 can be connected either directly or via one or more networks. Such networks can include wired and wireless networks, including, but not limited to, a cellular network, a wide area network (WAN) (e.g., the Internet), or a local area network (LAN), non-limiting examples of which include cellular, WAN, wireless fidelity (Wi-Fi), Wi-Max, WLAN, radio communication, microwave communication, satellite communication, optical communication, sonic communication, or any other suitable communication technology. Moreover, the aforementioned systems and/or devices have been described with respect to interaction between several components. It may be appreciated that such systems and components can include these components or sub-components specified therein, some of the specified components or sub-components, and/or additional components. Sub-components may also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art.

The subject computer processing systems, methods apparatuses and/or computer program products can be employed to solve new problems that arise through advancements in technology, computer networks, the Internet and the like.

Quantum circuits input/output connections have increased demand in size and complexity. There is continued progress being made for 3D integration and radio-frequency packaging techniques. Moreover, there are other developed technologies in the field of circuit QED from room temperature microwave devices and complex superconducting circuits. There are many proposals implemented for multi-layer microwave integrated quantum circuit architecture that adapts existing circuit design and other fabrication techniques. Quantum information processing is developing rapidly in many implementations and in particular superconducting quantum circuits. Superconducting quantum circuits have challenges that prevent a scaling strategy similar to that of classical integrated circuits. Qubits strong electromagnetic interactions allow efficient entanglement and control and susceptible to degraded quantum information. The resulted crosstalk is due to undesirable mixing of quantum states or decoherence. Thus, it is desirable to prevent crosstalk effects as high-Q qubits (Q≈106-109) may also be coupled to high-speed, low-Q (Q≈103) elements for readout, control, and feedback. Also, the high Q may be limited by the quality of the TSV itself in terms of low loss.

Turning back to the quantum circuit packaging 200 of FIG. 2, in general, electronic components may be connected together through different techniques. One such method is through wire bonding. Wire bonding is a well-known technique for forming electrical interconnections between an electronic component such as a printed circuit board (PCB) or an integrated circuit (IC). As shown, the quantum circuit package 200 includes two chips with inward facing surfaces utilized for devices and signal delivery/readout. A quantum circuit typically has a 2D array of qubits. The schematic is a 2-stack representation wherein the qubit chip 202 is connected to a wiring and signal processing circuitry chip through the interposer chip 206. The qubit chip 202 is utilized for qubits and the interconnections which allow qubits to entangle. The interposer surface 206 is utilized for readout resonators, filters, feed and readout lines. The bump bonds 204 are connected to the qubit chip 202, and are formed from a low temperature solder material and provided with a size and/or shape that enables an electrical connection to be made at point of contact. The bump bonds 204 may be utilized to mechanically and electrically connect an electronic connector (e.g., direct current (DC) signals and/or radio frequency (RF) signals) to a first substrate. The bump bonds 204 can also be utilized to mechanically and electrically connect the first substrate to a second substrate.

Mapping long range buses is a challenge when the problem is to access high quality surfaces such as superconducting metal directly depositing in a wafer for propagating signals. The quality of signals can be characterized by the Q factor. As noted above, for example, in connection with oscillators or resonators, the high Q may be limited by the quality of the TSV itself in terms of low loss. Q factor is well described for resonators but not for low-loss, low-impedance transmission lines. Typically, qubits are harmonic resonators with 4-5 GHz of frequency. The largest devices published are <100 qubits and with a natural frequency of about 4-5 GHz with a reduction in amplitude of a device. This may cause lossy connections and may cause a significant reduction in qubit coherence times and therefore limit it's use in quantum calculation. High quality interfaces may not have oxide present because of intrinsic loss associated with these kinds of dielectric materials, and this eliminates any CMOS type of structure for wiring. Having only two high quality surfaces arranged with vertical connections limit the kind of structures that can be built. For example, it is difficult to arrange more complicated interaction schemes (e.g., to allow distant qubits to couple together) by using only these two surfaces. With nearest-neighbor coupling implemented on a qubit surface, adding a second set of connections to distant qubits would require transferring coupling lines down to the interposer surface and back up to the qubit surface to achieve crossovers. This would make the coupling potentially have less quality signal, complicate the layout, and likely lead to increased signal crosstalk. Thus, embodiments herein propose an efficient method to utilize superconducting TSVs to access the high-quality surface on the back side of the qubit or interposer wafer. A multi-layer topology is proposed to ensure cross talk is reduced and produce high quality connection. Moreover, the connections within the interposer wafer to the metal lines underneath allow for complex signal transfer.

Figure 3:
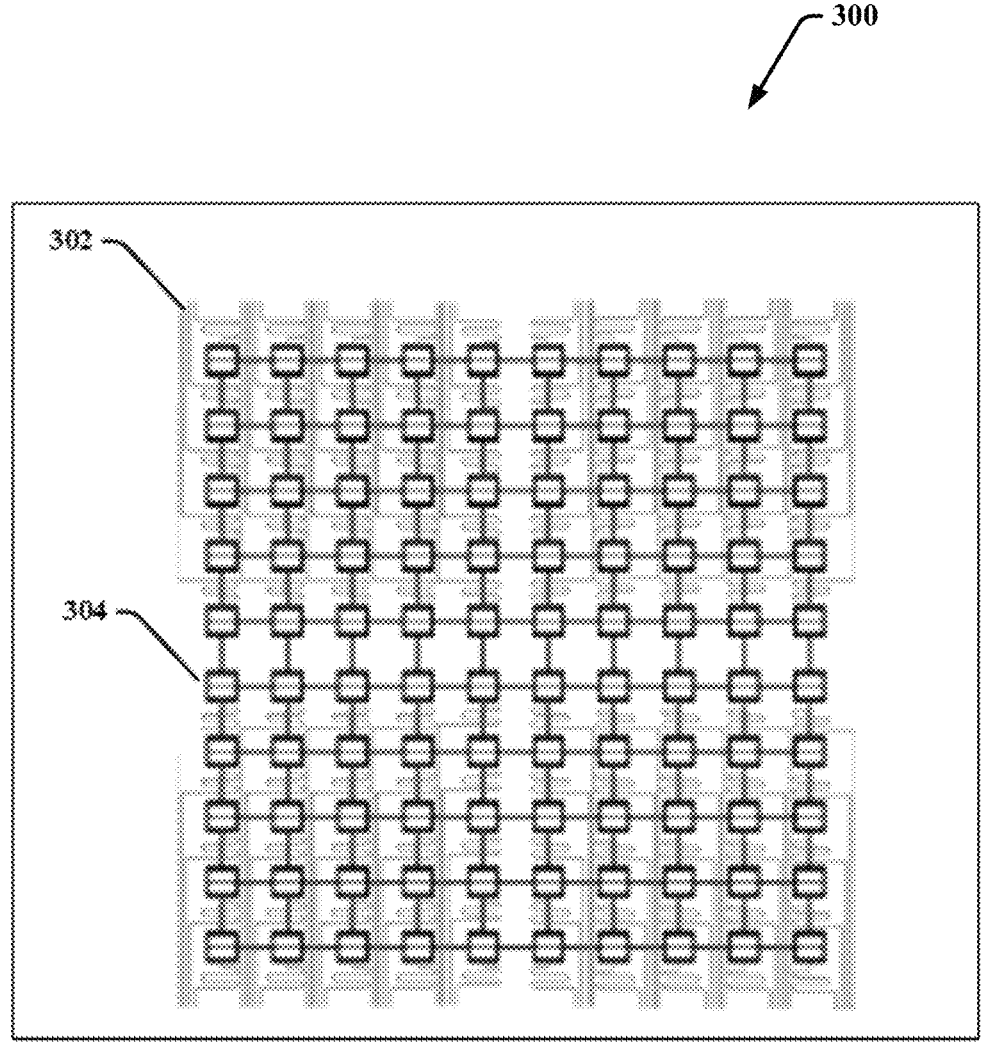
FIG. 3 illustrates an example qubit chip surface top view lattice in accordance with embodiments.

FIG. 3 illustrates an example qubit chip surface top view lattice. In the qubit chip surface 300, the qubits are black squares 304. As the chips grow larger, the structure becomes problematic. In the qubit chip surface 300, the red lines 302 are readout resonators. These resonators typically reside on the interposer chip 206 and these wires 302 typically allow to program a qubit. The qubit connections on the qubit chip from this lattice allow to entangle qubits. Although it is possible to mix functions between these two layers, the intersecting patterns of red and black lines means that the bump bonds can be utilized to provide crossovers in these locations. There are two challenges that are faced in this design, namely, if the quantum circuit does not have a 2D nearest neighbour lattice. If left-hand qubits are connected to right hand qubits or if top qubits are connected to bottom qubits then the red and black layers of wiring would be problematic. Moreover, by running a respective bus between two distant qubits, busses may run directly past intervening qubits. This may result in additional cross talk and cause inadvertent control signals to get applied to unintended qubits and thus can eventually cause degradation of a quantum calculation. It becomes challenging to have long range connections entangled between the black layer simultaneously connected to neighbours. This type of intersection of wires can cause a short circuit. If attempts are made to bounce back and forth using the bump-bonds that are connected to the chips, then it is not a practical topological solution. These connections are single photon interaction between qubits wherein the red signals are high power signals and there are very low signals between the qubits. For example, if a program signal with high frequency microwave pulses are chosen and as the resonators 302 are in proximity with the black lines/qubits 304 then the other qubits that are also in the proximity are compromised while trying to program the one qubit in question. Thus, these connections are highly sensitive to crosstalk. In an implementation, the red line resonators 302 in the lower left comes out of a qubit 304. It traverses in the street between the qubits down to the edge where the signals are extracted to an output. The high-power lines that are next to the qubits on either side of the channel can cause cross talk and this is considered to be a constant problem.

Figure 4:
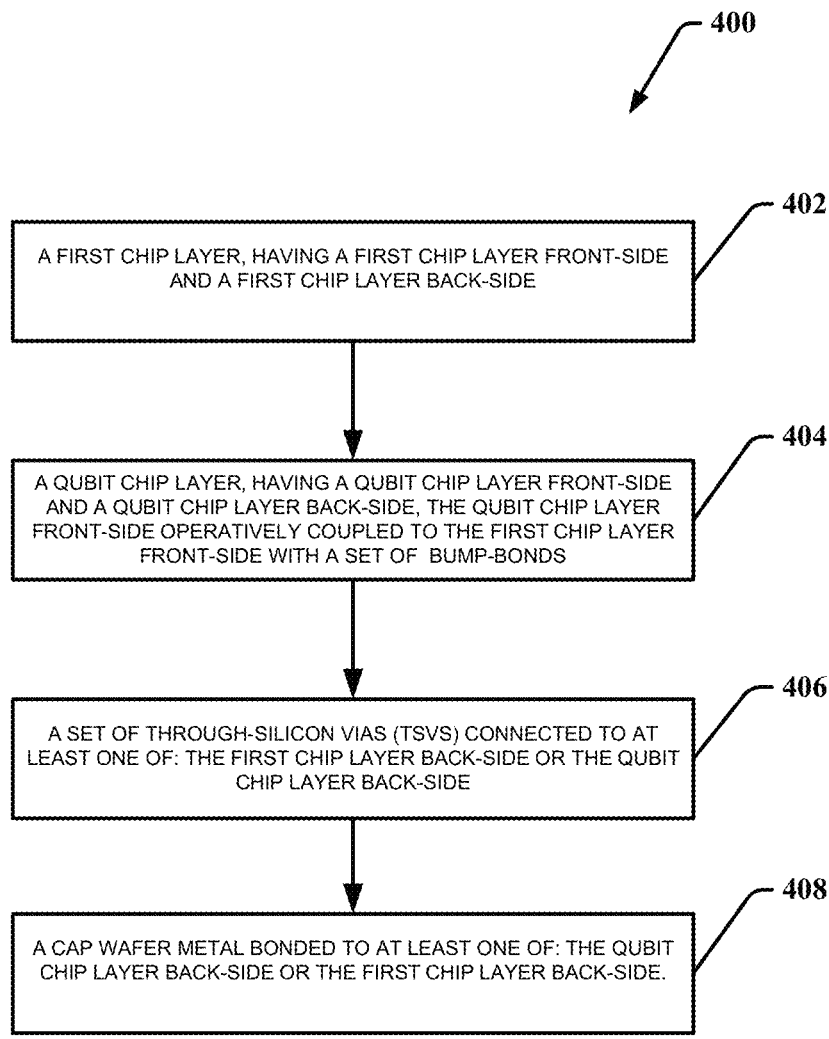
FIG. 4 illustrates an example flowchart for creating a protected layer for interconnects and devices in a packaged structure in accordance with embodiments.

FIG. 4 illustrates an example flowchart 400 for creating a protected layer for interconnects and devices in packaged structure. At 402, a first chip layer is provided that has a first chip layer front-side and a first chip layer back-side. At 4040, a qubit chip layer has a qubit chip layer front-side and a qubit chip layer back-side, the qubit chip layer front-side is operatively coupled to the first chip layer front-side with a set of bump-bonds. At 406, a set of through-silicon vias (TSVs) are connected to at least one of: the first chip layer back-side or the qubit chip layer back-side. At 408, a cap wafer metal is bonded to at least one of: the qubit chip layer back-side or the first chip layer back-side. The qubits of the qubit chip layer are on an exposed surface. A set of qubits of the qubit chip layer are connected by in-plane buses and buried layer buses. Moreover, the superconducting metal directly deposits in super conducting waiver for propagating signals. The quality of signals can be characterized by the Q factor. The Q factor is well described for resonators but not for low-loss, low-impedance transmission lines. As noted above, for example, in connection with oscillators or resonators, the high Q may be limited by the quality of the TSV itself in terms of low loss. The Q factor is associated with interconnects of the device is at least 100000. The Q factor is associated with interconnects of the device is within the range of 500000 to 2000000. One of the qubit chip layer back-side or the first chip layer back-side is operatively coupled to a filter, qubit feed line, resonator or a coupler. The cap wafer comprises at least one cavity that comprises an inter-connection material. In wire bonding electronic components, the connection materials can consist of at least one of: gold (Au), copper (Cu), silver (Ag), aluminum (Al) or any other suitable material. The inter-connection material in the proposed embodiments can consist of at least one of the following materials: In, InSn, PbSn, SnAgCu, InBiSn, InSnAg, SnAg, InAg, or any suitable material.

Figure 5:
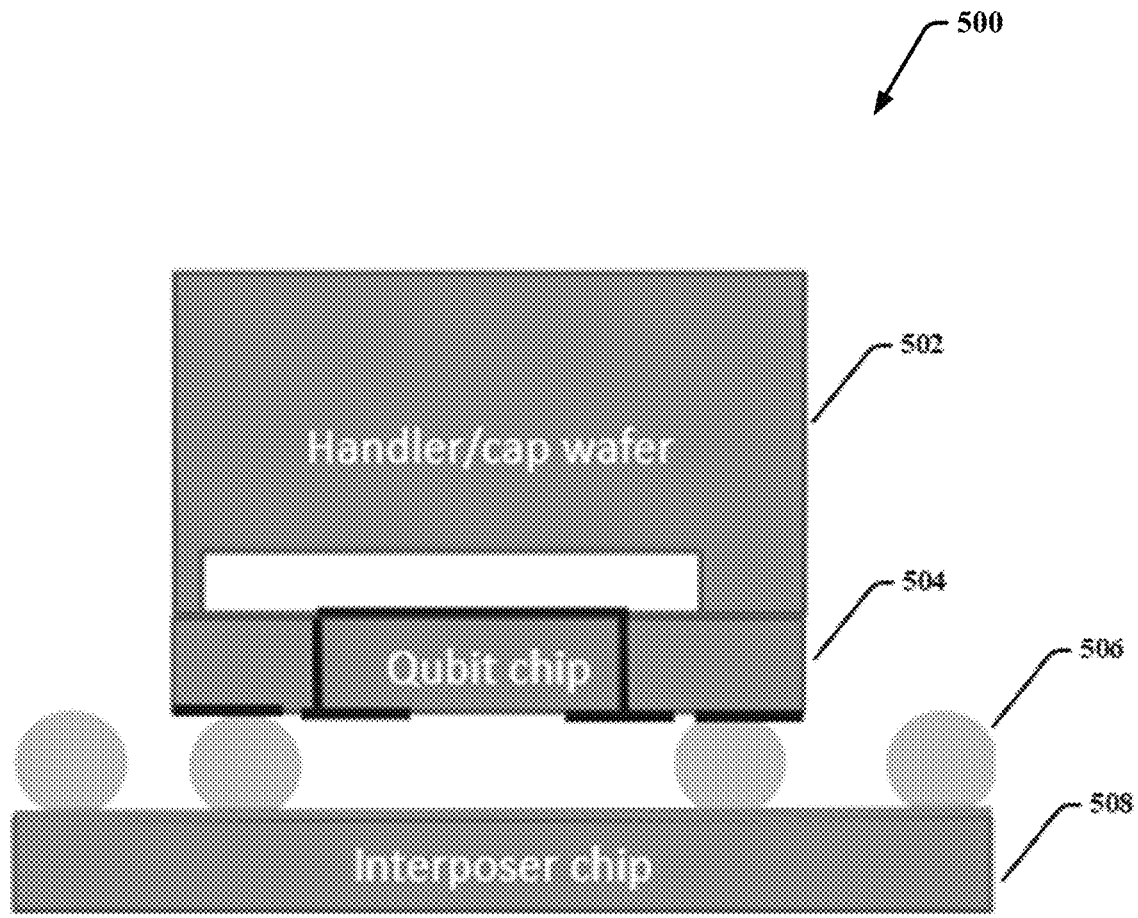
FIG. 5 illustrates an example schematic of a multi-layer superconducting device in accordance with embodiments.

FIG. 5 illustrates an example schematic of a multi-layer superconducting device 500. As illustrated, superconducting TSVs are utilized to access high-quality surface on the back side of qubit 504 or interposer chip 508. In order to protect the new surfaces from proximity to lossy materials such as adhesive or silicon oxide, a special cap wafer 502 is metal bonded to the top of the thinned qubit wafer 504, forming a fully enclosed metal channel in which long-range connections are fabricated. Also, bump-bonds 506 are connected to the qubit chip 504. As an example, these embodiments propose to allow a second interconnect layer for long-range bus connections in addition to nearest neighbor connections which already exist on a qubit bottom surface. In order to mitigate crosstalk, the connection is from a back of the qubit chip 504 such that a signal can traverse from a qubit up through the backside of the chip 504 and contact to a high-quality metal interconnection (superconducting metal) which are patterned and thus travel back down to other qubits. There are several other possible geometries including using one or both of the additional layers on the backsides of two existing chips (e.g., the qubit chip 504 and the interposer chip 508). These extra high-quality layers have filters, qubits, feed lines, resonators, or couplers placed. The metal bond utilized to attach the cap wafer 502 can be hermetic however depending on requirements may or may not be hermetic. These embodiments assume that the TSVs have low loss, back side of the qubit chip 504 is clean, superconducting metal and the interface perform effectively. This results in a high-quality interconnect by having the TSVs connect to the backsides pure metal with no oxides. Moreover, to protect and prepare the device 500, the handler or cap wafer 502 can be attached to the qubit chip 504 permanently. In these embodiments, the wiring is isolated from one another and by the noise sources in the handler as well. The interposer chip or wafer 508 can avoid any oxides as it can be metal bonded to the qubit chip 504.

Qubits are connected by the TSVs through a buried metallized layer on which the strip line connections are formed along with metal-metal bonding between the two wafers (qubit chip wafer and interposer chip wafer). The strip lines connect to the back side of the TSVs. The cavities are etched into a silicon cap to leave space for connection lines. It is optional to leave physical space for cross-connection wire. Moreover, qubits are on an exposed surface and qubits are connected by both in-plane busses and buried layer busses to increase complexity. Embodiments herein propose structure wherein the layer can be on either qubit or interposer backsides and/or both. Conventional designs mainly focus on metal-metal bond in cavities and coupling to a 3D cavity while these embodiments provide for novel interconnecting schemes. Conventional structures also focus on qubit(s) enclosed in a cavity; however, embodiments herein propose to leave qubit(s) on an exposed surface and couple qubit to qubit using wire. Conventional structures utilize 3D resonant cavities explicitly whereas embodiments herein utilize coplanar waveguides (CPWs). Conventional structures for qubits are on free-standing thinned substrates which are embedded in a cavity. Embodiments herein can discuss transition between CPW and TSVs for impedance matching and focus on buried layer resonator as busses.

Figure 6:
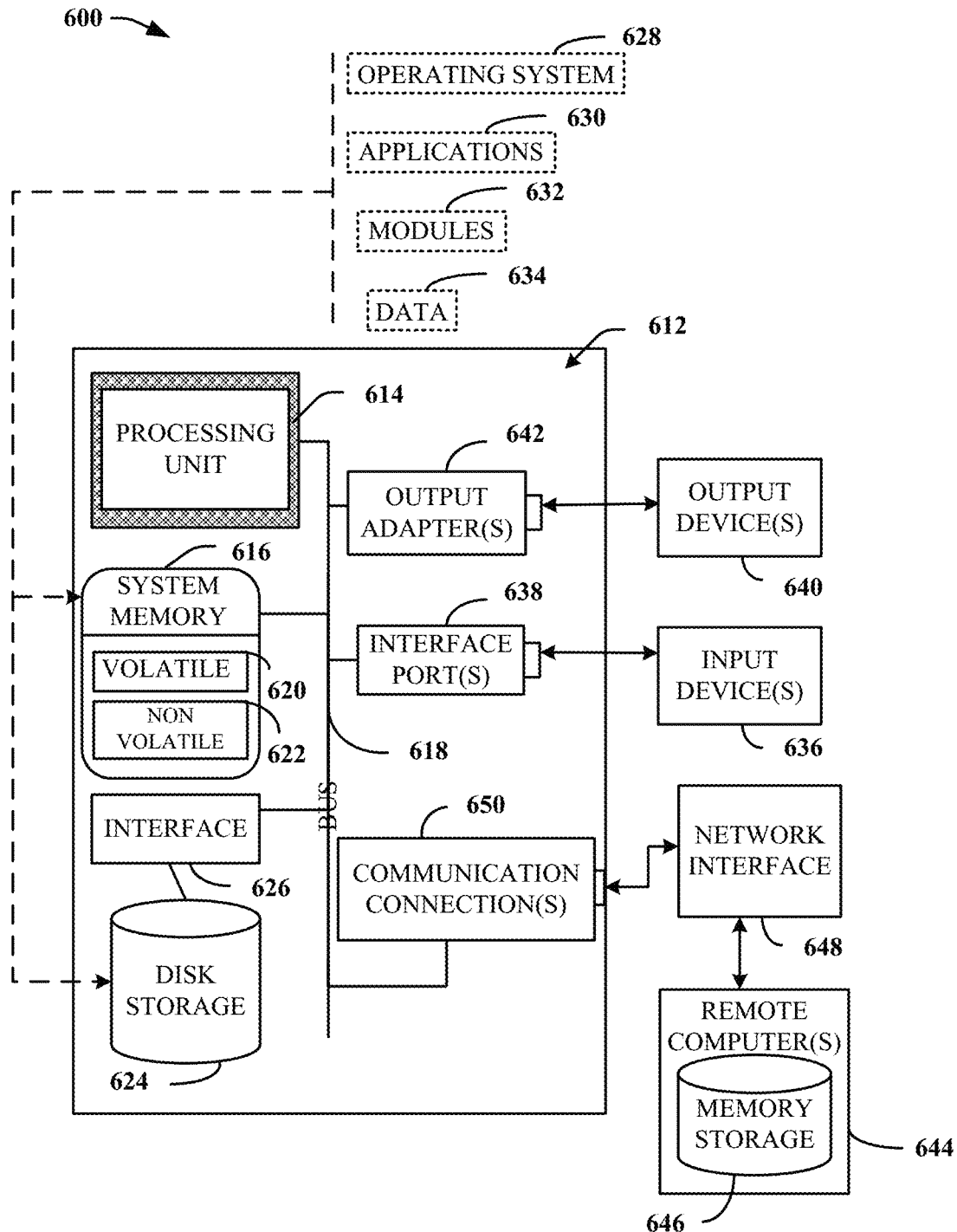
FIG. 6 illustrates a block diagram of an example, non-limiting, operating environment in which one or more embodiments described herein can be facilitated.

To provide a context for the various aspects of the disclosed subject matter, FIG. 6 as well as the following discussion are intended to provide a general description of a suitable environment in which the various aspects of the disclosed subject matter can be implemented. FIG. 6 illustrates a block diagram of an example, non-limiting operating environment in which one or more embodiments described herein can be facilitated. Repetitive description of like elements employed in other embodiments described herein is omitted for sake of brevity.

With reference to FIG. 6, a suitable operating environment 600 for implementing various aspects of this disclosure can also include a computer 612. The computer 612 can also include a processing unit 614, a system memory 616, and a system bus 618. The system bus 618 couples system components including, but not limited to, the system memory 616 to the processing unit 614. The processing unit 614 can be any of various available processors. Dual microprocessors and other multiprocessor architectures also can be employed as the processing unit 614. The system bus 618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 616 can also include volatile memory 620 and non-volatile memory 622. The basic input/output system (BIOS), containing the basic routines to transfer information between elements within the computer 612, such as during start-up, is stored in non-volatile memory 622. Computer 612 can also include removable/non-removable, volatile/non-volatile computer storage media. FIG. 6 illustrates, for example, a disk storage 624. Disk storage 624 can also include, but is not limited to, devices like a magnetic disk drive, floppy disk drive, tape drive, Jaz drive, Zip drive, LS-100 drive, flash memory card, or memory stick. The disk storage 624 also can include storage media separately or in combination with other storage media. To facilitate connection of the disk storage 624 to the system bus 618, a removable or non-removable interface is typically used, such as interface 626. FIG. 6 also depicts software that acts as an intermediary between users and the basic computer resources described in the suitable operating environment 600. Such software can also include, for example, an operating system 628. Operating system 628, which can be stored on disk storage 624, acts to control and allocate resources of the computer 612.

System applications 630 take advantage of the management of resources by operating system 628 through program modules 632 and program data 634, e.g., stored either in system memory 616 or on disk storage 624. It is to be appreciated that this disclosure can be implemented with various operating systems or combinations of operating systems. A user enters commands or information into the computer 612 through input device(s) 636. Input devices 636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 614 through the system bus 618 via interface port(s) 638. Interface port(s) 638 include, for example, a serial port, a parallel port, a game port, and a universal serial bus (USB). Output device(s) 640 use some of the same type of ports as input device(s) 636. Thus, for example, a USB port can be used to provide input to computer 612, and to output information from computer 612 to an output device 640. Output adapter 642 is provided to illustrate that there are some output devices 640 like monitors, speakers, and printers, among other output devices 640, which require special adapters. The output adapters 642 include, by way of illustration and not limitation, video and sound cards that provide a means of connection between the output device 640 and the system bus 618. It is to be noted that other devices and/or systems of devices provide both input and output capabilities such as remote computer(s) 644.

Computer 612 can operate in a networked environment using logical connections to one or more remote computers, such as remote computer(s) 644. The remote computer(s) 644 can be a computer, a server, a router, a network PC, a workstation, a microprocessor-based appliance, a peer device or other common network node and the like, and typically can also include many or all of the elements described relative to computer 612. For purposes of brevity, only a memory storage device 646 is illustrated with remote computer(s) 644. Remote computer(s) 644 is logically connected to computer 612 through a network interface 648 and then physically connected via communication connection 650. Network interface 648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection (s) 650 refers to the hardware/software employed to connect the network interface 648 to the system bus 618. While communication connection 650 is shown for illustrative clarity inside computer 612, it can also be external to computer 612. The hardware/software for connection to the network interface 648 can also include, for exemplary purposes only, internal and external technologies such as, modems including regular telephone grade modems, cable modems and DSL modems, ISDN adapters, and Ethernet cards.

Figure 7:
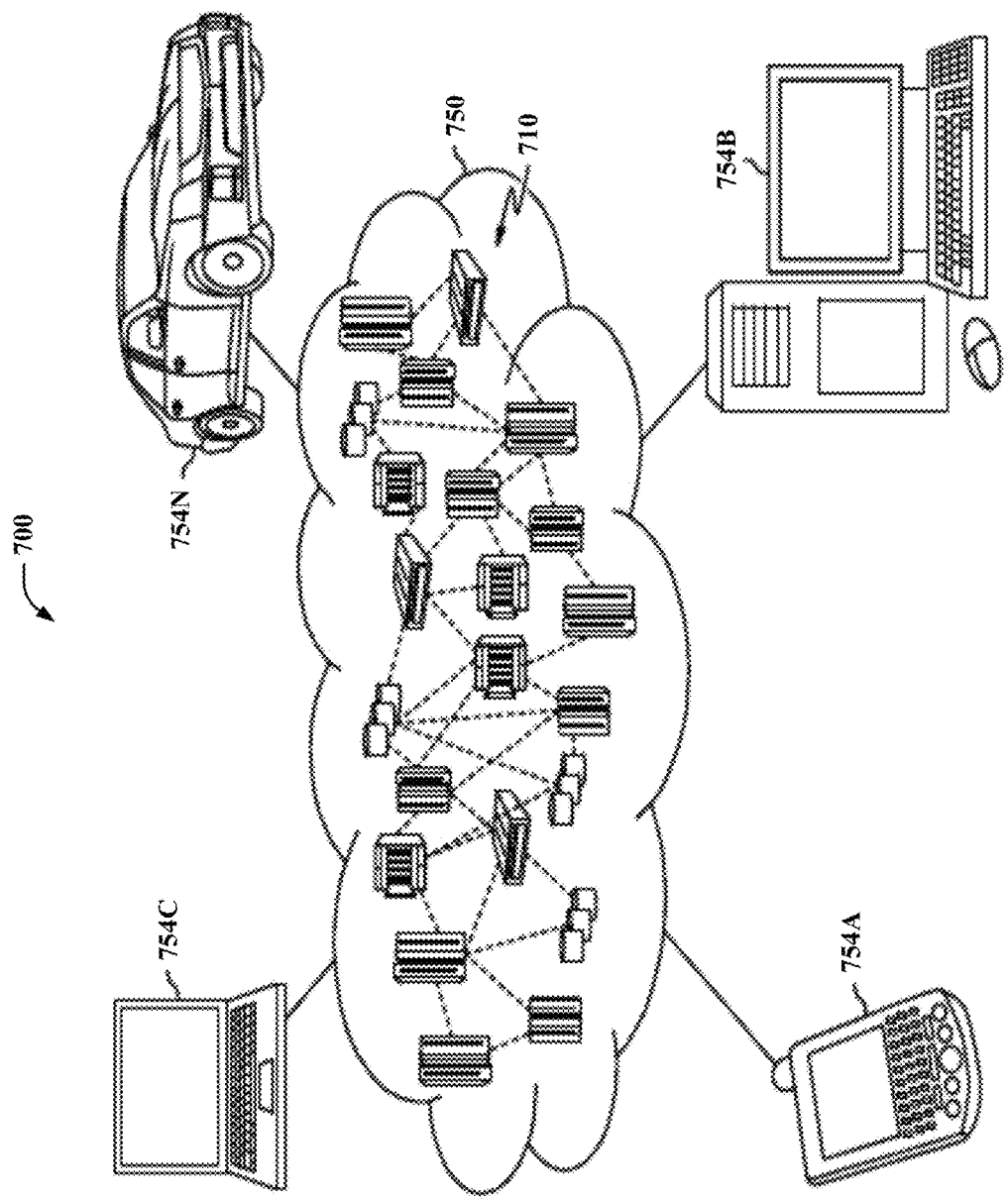
FIG. 7 illustrates a block diagram of an example, non-limiting, cloud computing environment in accordance with one or more embodiments of the subject disclosure.

Referring now to FIG. 7, an illustrative cloud computing environment 750 is depicted. As shown, cloud computing environment 750 includes one or more cloud computing nodes 710 with which local computing devices used by cloud consumers, such as, for example, personal digital assistant (PDA) or cellular telephone 754A, desktop computer 754B, laptop computer 754C, and/or automobile computer system 754N may communicate. Although not illustrated in FIG. 7, cloud computing nodes 710 can further comprise a quantum platform (e.g., quantum computer, quantum hardware, quantum software, etc.) with which local computing devices used by cloud consumers can communicate. Nodes 710 may communicate with one another. It may be grouped (not shown) physically or virtually, in one or more networks, such as Private, Community, Public, or Hybrid clouds as described hereinabove, or a combination thereof. This allows cloud computing environment 750 to offer infrastructure, platforms and/or software as services for which a cloud consumer does not need to maintain resources on a local computing device. It is understood that the types of computing devices 754A-N shown in FIG. 7 are intended to be illustrative only and that computing nodes 710 and cloud computing environment 750 can communicate with any type of computerized device over any type of network and/or network addressable connection (e.g., using a web browser).

Figure 8:
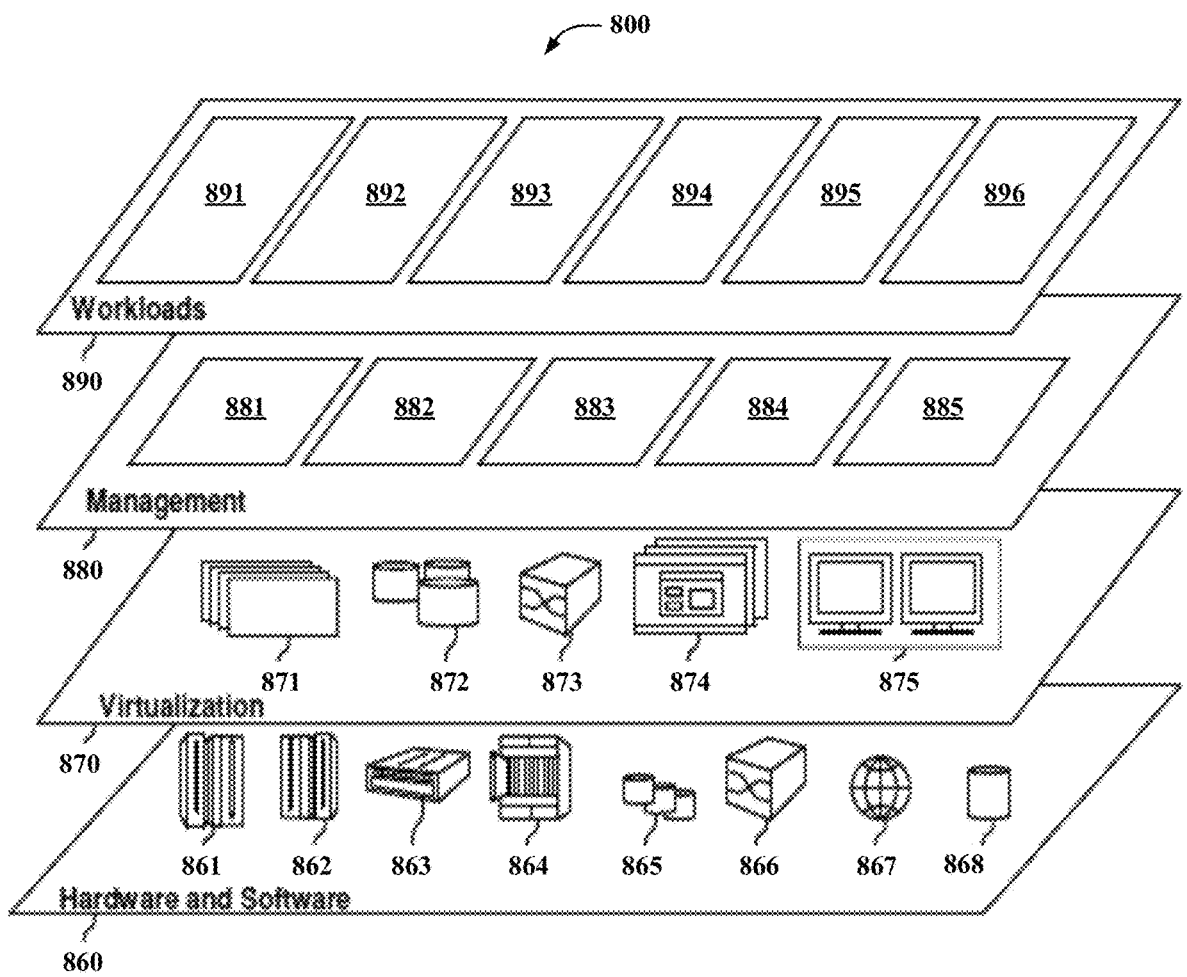
FIG. 8 illustrates a block diagram of example, non-limiting, abstraction model layers in accordance with one or more embodiments of the subject disclosure.

Referring now to FIG. 8, a set of functional abstraction layers provided by cloud computing environment 750 (FIG.

7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 860 includes hardware and software components. Examples of hardware components include: mainframes 861; RISC (Reduced Instruction Set Computer) architecture-based servers 862; servers 863; blade servers 864; storage devices 865; and networks and networking components 866. In some embodiments, software components include network application server software 867, quantum platform routing software 868, and/or quantum software (not illustrated in FIG. 8).

Virtualization layer 870 provides an abstraction layer from which the following examples of virtual entities may be provided: virtual servers 871; virtual storage 872; virtual networks 873, including virtual private networks; virtual applications and operating systems 874; and virtual clients 875.

In one example, management layer 880 may provide the functions described below. Resource provisioning 881 provides dynamic procurement of computing resources and other resources that are utilized to perform tasks within the cloud computing environment. Metering and Pricing 882 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 883 provides access to the cloud computing environment for consumers and system administrators. Service level management 884 provides cloud computing resource allocation and management such that required service levels are met. Service Level Agreement (SLA) planning and fulfillment 885 provide pre-arrangement for, and procurement of, cloud computing resources for which a future requirement is anticipated in accordance with an SLA.

Workloads layer 890 provides examples of functionality for which the cloud computing environment may be utilized. Non-limiting examples of workloads and functions which may be provided from this layer include: mapping and navigation 891; software development and lifecycle management 892; virtual classroom education delivery 893; data analytics processing 894; transaction processing 895; and quantum state preparation software 896.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It can be understood that a block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, a block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It can also be noted that a block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art may recognize that this disclosure also can or can be implemented in combination with other program modules. Generally, program modules include routines, programs, components, data structures, etc. that perform particular tasks and/or implement particular abstract data types. Moreover, those skilled in the art may appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or non-volatile memory, or can include both volatile and non-volatile memory. By way of illustration, and not limitation, non-volatile memory can include read only memory (ROM), programmable ROM (PROM), electrically programmable ROM (EPROM), electrically erasable ROM (EEPROM), flash memory, or non-volatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations maybe apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a first chip layer, having a first chip layer front-side and a first chip layer back-side;
    a qubit chip layer, having a qubit chip layer front-side and a qubit chip layer back-side, the qubit chip layer front-side operatively coupled to the first chip layer front-side with a set of bump-bonds;
    a set of through-silicon vias (TSVs) connected to at least one of: the first chip layer back-side or the qubit chip layer back-side; and
    a cap wafer metal bonded to at least one of: the qubit chip layer back-side or the first chip layer back-side,
    wherein a set of qubits of the qubit chip layer are connected by in-plane buses and buried layer buses wherein in-plane buses are on the first qubit chip surface and the buried layer buses are on the second qubit chip surface.

2. The device of claim 1, wherein the at least one of the qubit chip layer back-side or the first chip layer back-side is operatively coupled to a filter.

3. The device of claim 1, wherein the at least one of the qubit chip layer back-side or the first chip layer back-side is operatively coupled to a qubit feed line.

4. The device of claim 1, wherein the at least one of the qubit chip layer back-side or the first chip layer back-side is operatively coupled to a resonator.

5. The device of claim 1, wherein the at least one of the qubit chip layer back-side or the first chip layer back-side is operatively coupled to a coupler.

6. The device of claim 1, wherein the cap wafer comprises at least one cavity that employs a metal coating inside the cavity which is either the same or a different metal than the bonding metal wherein the metal coating contacts the bonding metal to form a ground.

7. The device of claim 6, wherein an inter-connection material consists of at least one of the following: In, InSn, PbSn, SnAgCu, InBiSn, InSnAg, SnAg, or InAg.

8. The device of claim 1, wherein qubits of the qubit chip layer are on an exposed surface.

9. A method, comprising:
    forming a first chip layer, having a first chip layer front-side and a first chip layer back-side;
    forming a set of bump bonds on the first chip layer front-side;
    forming a qubit chip layer, having a qubit chip layer front-side and a qubit chip layer back-side, the qubit chip layer front-side operatively coupled to the first chip layer front-side with the set of bump bonds;
    forming a set of through-silicon vias (TSVs) connected to at least one of: the first chip layer back-side or the qubit chip layer back-side;
    forming a cap wafer metal bonded to at least one of: the qubit chip layer back-side or the first chip layer back-side; and
    connecting a set of qubit chips of the qubit chip layer with in-plane buses and buried layer buses wherein in-plane buses are on the first qubit chip surface and the buried layer buses are on the second qubit chip surface.

10. The method of claim 9, further comprising coupling the at least one of the qubit chip layer back-side or the first chip layer back-side to a filter.

11. The method of claim 9, further comprising coupling the qubit chip layer back-side or the first chip layer back-side to a qubit feed line.

12. The method of claim 9, further comprising coupling the qubit chip layer back-side or the first chip layer back-side to a resonator.

13. The method of claim 9, further comprising coupling the qubit chip layer back-side or the first chip layer back-side to a coupler.

14. The method of claim 9, further comprising forming the cap wafer with cavities that employ a metal coating inside the cavity which is either the same or a different metal than the bonding metal wherein this metal coating contacts with the bonding metal to form a ground.

15. The method of claim 9, further comprising forming qubits are on an exposed surface.

16. A device, comprising:
   a first chip layer, having a first chip layer front-side and a first chip layer back-side;
   a qubit chip layer, having a qubit chip layer front-side and a qubit chip layer back-side, the qubit chip layer front-side operatively coupled to the first chip layer front-side with a set of bump bonds;
   a set of through-silicon vias (TSVs) connected to at least one of: the first chip layer back-side or the qubit chip layer back-side;
   a cap wafer metal bonded to at least one of: the qubit chip layer back-side or the first chip layer back-side wherein the cap wafer comprises at least one cavity comprising an inter-connection material; and
   wherein the at least one of the qubit chip layer back-side or the first chip layer back-side is operatively coupled to at least one element selected from the group consisting of: a filter and a qubit feed line.

* * * * *